United States Patent
Ito

(10) Patent No.: US 10,529,607 B2
(45) Date of Patent: Jan. 7, 2020

(54) SUBSTRATE PROCESSING APPARATUS AND METHOD OF MANUFACTURING SEMICONDUCTOR DEVICE

(71) Applicant: HITACHI KOKUSAI ELECTRIC INC., Tokyo (JP)

(72) Inventor: Takeshi Ito, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 15/900,283

(22) Filed: Feb. 20, 2018

(65) Prior Publication Data

US 2018/0174877 A1 Jun. 21, 2018

Related U.S. Application Data

(63) Continuation of application No. PCT/JP2015/074464, filed on Aug. 28, 2015.

(51) Int. Cl.
*H01L 21/677* (2006.01)
*H01L 21/67* (2006.01)
(Continued)

(52) U.S. Cl.
CPC .. *H01L 21/67715* (2013.01); *C23C 16/45527* (2013.01); *C23C 16/50* (2013.01); *H01L 21/6773* (2013.01); *H01L 21/67265* (2013.01); *H01L 21/67706* (2013.01); *H01L 21/67736* (2013.01); *H01L 21/0217* (2013.01); *H01L 21/0228* (2013.01); *H01L 21/02274* (2013.01)

(58) Field of Classification Search
CPC ........... H01L 21/6773; H01L 21/67739; H01L 21/67763; H01L 21/67775; H01L 21/67769; H01L 21/67715; H01L 21/67265
See application file for complete search history.

(56) References Cited

U.S. PATENT DOCUMENTS 5,443,346 A * 8/1995 Murata ............. H01L 21/67727
414/222.13
5,562,383 A * 10/1996 Iwai .................. H01L 21/67769
118/719
(Continued)

FOREIGN PATENT DOCUMENTS

JP 2000-311935 A 11/2000
JP 2002-175998 A 6/2002
(Continued)

OTHER PUBLICATIONS

International Search Report for WO 2017/037785 A1, dated Nov. 2, 2015.
(Continued)

*Primary Examiner* — Kaitlin S Joerger
(74) *Attorney, Agent, or Firm* — Volpe and Koenig, P.C.

(57) ABSTRACT

A substrate processing apparatus includes an accommodating chamber including a loading shelf configured to load a storage vessel that accommodates a substrate; a transfer mechanism installed in a ceiling part of the accommodating chamber and configured to hold an upper portion of the storage vessel and transfer the storage vessel; and a port configured to load and unload the storage vessel to and from the accommodating chamber.

15 Claims, 11 Drawing Sheets

(51) Int. Cl.
   *H01L 21/02*   (2006.01)
   *C23C 16/455*  (2006.01)
   *C23C 16/50*   (2006.01)

(56) References Cited

U.S. PATENT DOCUMENTS

| | | | | |
|---|---|---|---|---|
| 6,092,678 | A * | 7/2000 | Kawano | H01L 21/67733 |
| | | | | 212/286 |
| 6,129,496 | A * | 10/2000 | Iwasaki | H01L 21/67276 |
| | | | | 414/222.01 |
| 6,169,935 | B1 * | 1/2001 | Iwasaki | H01L 21/67276 |
| | | | | 700/214 |
| 6,379,096 | B1 * | 4/2002 | Beutler | B65G 1/0478 |
| | | | | 414/281 |
| 6,481,558 | B1 | 11/2002 | Bonora et al. | |
| 6,575,178 | B1 * | 6/2003 | Kamikawa | B08B 3/10 |
| | | | | 134/88 |
| 6,582,182 | B2 * | 6/2003 | Whalen | H01L 21/67769 |
| | | | | 414/276 |
| 6,663,332 | B1 * | 12/2003 | Sluijk | H01L 21/67769 |
| | | | | 414/160 |
| 6,772,032 | B2 * | 8/2004 | Iwasaki | H01L 21/67271 |
| | | | | 414/222.01 |
| 6,799,521 | B2 * | 10/2004 | Tai | B65G 1/0414 |
| | | | | 104/88.01 |
| 7,661,919 | B2 * | 2/2010 | Bonora | H01L 21/67727 |
| | | | | 414/222.01 |
| 7,740,437 | B2 * | 6/2010 | De Ridder | H01L 21/67769 |
| | | | | 414/217.1 |
| 7,934,880 | B2 * | 5/2011 | Hara | G03F 7/70525 |
| | | | | 118/66 |
| 8,128,333 | B2 * | 3/2012 | Aburatani | H01L 21/67766 |
| | | | | 414/217 |
| 8,851,819 | B2 | 10/2014 | Kamikawa et al. | |
| 9,004,840 | B2 * | 4/2015 | Kinugawa | H01L 21/67733 |
| | | | | 414/281 |
| 9,543,178 | B2 * | 1/2017 | Lee | H01L 21/67294 |
| 9,633,879 | B2 * | 4/2017 | Ito | B65G 1/0464 |
| 9,698,036 | B2 * | 7/2017 | Aguilar | H01L 21/6773 |
| 9,852,936 | B2 * | 12/2017 | Lee | B65G 1/137 |
| 9,899,245 | B2 * | 2/2018 | Kikuchi | H01L 21/67379 |
| 9,966,289 | B2 * | 5/2018 | Kamimura | H01L 21/67769 |
| 10,069,030 | B2 * | 9/2018 | Gonzalez | H01L 31/18 |
| 2007/0163461 | A1 * | 7/2007 | Shiwaku | H01L 21/67715 |
| | | | | 104/89 |
| 2009/0024244 | A1 * | 1/2009 | Harris | H01L 21/67772 |
| | | | | 700/121 |
| 2009/0053665 | A1 * | 2/2009 | Haraki | H01L 21/67109 |
| | | | | 432/1 |
| 2010/0047045 | A1 * | 2/2010 | Park | H01L 21/67769 |
| | | | | 414/222.07 |
| 2012/0237323 | A1 * | 9/2012 | Sugawara | H01L 21/67772 |
| | | | | 414/411 |
| 2016/0247699 | A1 | 8/2016 | Kamimura et al. | |

FOREIGN PATENT DOCUMENTS

| | | |
|---|---|---|
| JP | 2007-096140 A | 4/2007 |
| JP | 2012-169534 A | 9/2012 |
| KR | 20010082371 A | 8/2001 |
| KR | 20080047985 A | 5/2008 |
| KR | 101531428 B1 | 6/2015 |
| WO | 2015/046062 A1 | 4/2015 |

OTHER PUBLICATIONS

Korean Office Action dated Jul. 15, 2019 for the Korean Patent Application No. 10-2018-7001243.

* cited by examiner

US 10,529,607 B2

SUBSTRATE PROCESSING APPARATUS AND METHOD OF MANUFACTURING SEMICONDUCTOR DEVICE

CROSS-REFERENCE TO RELATED APPLICATION(S)

This application is a Bypass Continuation Application of PCT international Application No. PCT/JP2015/074464, filed on Aug. 28, 2015, the entire contents of which are incorporated herein by reference.

TECHNICAL FIELD

The present disclosure relates to a substrate processing apparatus and a method of manufacturing a semiconductor device.

BACKGROUND

The heat treatment of a substrate in the manufacturing process of a semiconductor device has, for example, employed a vertical type substrate processing apparatus. In the vertical type substrate processing apparatus, a robot hand is used to transfer a storage vessel in an accommodating chamber which temporarily stores such a storage vessel that accommodates a plurality of substrates.

However, the difficulty of miniaturizing a mechanical part of the robot hand has made it hard to reduce a footprint of the apparatus by saving the space of the accommodating chamber.

SUMMARY

Some embodiments of the present disclosure provide a technique capable of reducing a footprint of an apparatus.

According to one embodiment of the present disclosure, there is provided a structure including: an accommodating chamber including a loading shelf configured to load a storage vessel that accommodates a substrate; a transfer mechanism installed in a ceiling part of the accommodating chamber and configured to hold an upper portion of the storage vessel and transfer the storage vessel; and a port configured to load and unload the storage vessel to and from the accommodating chamber, wherein the port includes: an adjustment plate fixed onto a base; a stage configured to load the storage vessel; and a horizontal driving mechanism that is installed on an upper portion of the adjustment plate, connected to a rear portion of a lower surface of the stage via a connection member, and configured to horizontally move the stage, and wherein the horizontal driving mechanism includes: a pair of guide parts, whose first ends are connected to each other, configured to guide the horizontal movement of the stage; and a first driving part which is installed between the guide parts and which is configured to press a connection portion of the guide parts.

DETAILED DESCRIPTION

Figure 1:
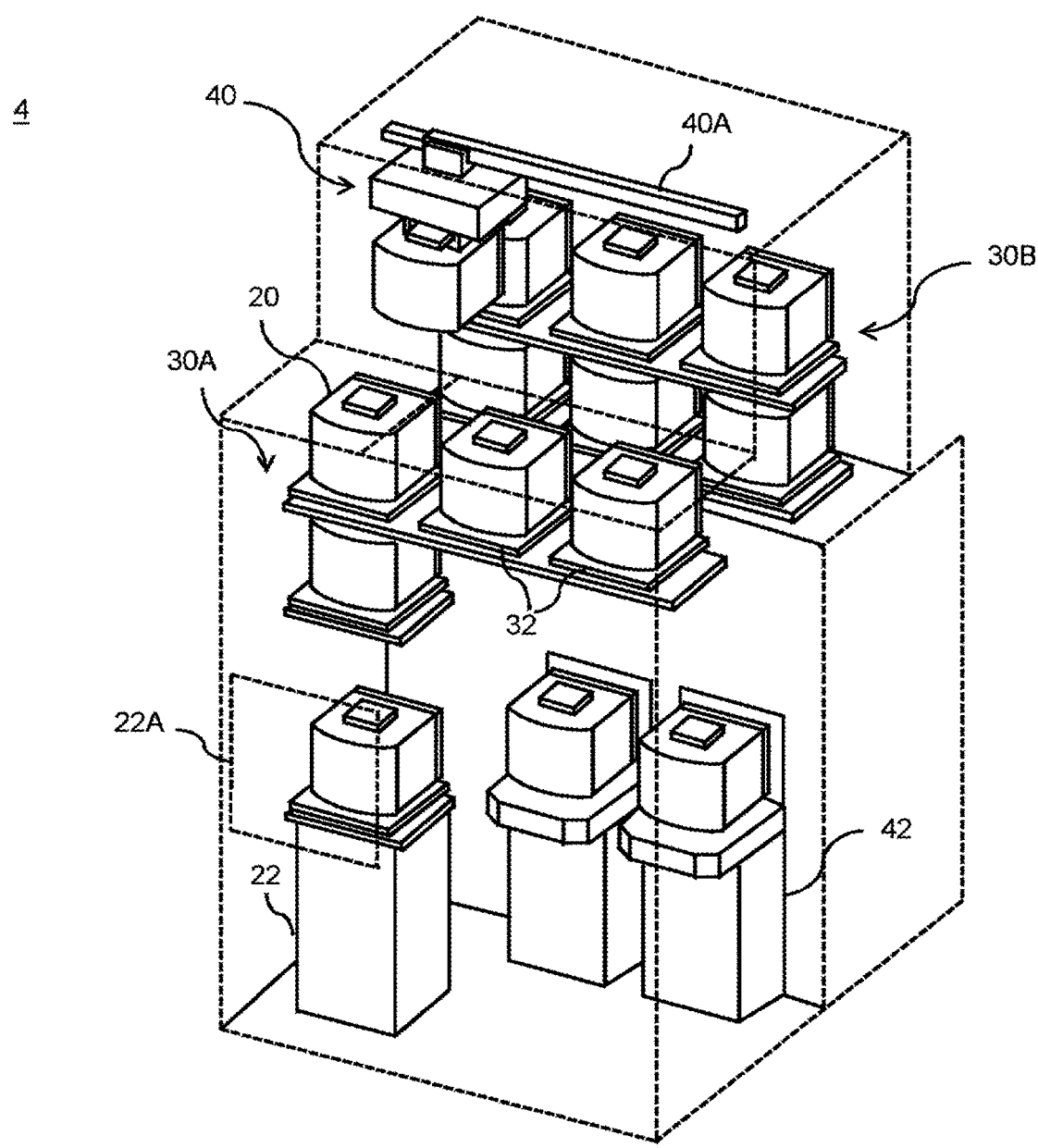
FIG. 1 is an oblique perspective view of an accommodating chamber that is suitably used in a first embodiment of the present disclosure.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

Hereinafter, a first embodiment of the present disclosure will be described with reference to FIGS. 1 to 3.

(1) Configuration of the Substrate Processing Apparatus

As illustrated in FIG. 1, in this embodiment, a substrate processing apparatus 4 is configured as a vertical type heat treatment apparatus (a batch-type vertical type heat treatment apparatus) that performs a heat treatment process in an IC manufacturing method. Furthermore, in the vertical type heat treatment apparatus to which the present disclosure is applied, a front opening unified pod (FOUP) (hereinafter, referred to as a "pod") 20 is used as a carrier for transferring a wafer W as a substrate. The substrate processing apparatus 4 includes a processing furnace 8, an accommodating chamber 12, and a transfer chamber 16, which will be described later.

(Accommodating Chamber)

An accommodating chamber 12 which carries the pod 20 into the apparatus and stores the same is arranged on a front side in a housing of the substrate processing apparatus 4. A loading/unloading port 22A, which is an opening for loading and unloading the pod 20 into and from the accommodating chamber 12, is installed on a front side in the housing of the accommodating chamber 12 so as to communicate with the inside and outside of the housing of the accommodating chamber 12. The loading/unloading port 22A may be configured to be opened and closed by a front shutter. An AGV port (I/O stage) 22 is installed inside the housing of the loading/unloading port 22A. A load port 42 as described hereinbelow is installed on a wall surface between the accommodating chamber 12 and the transfer chamber 16. The pod 20 is loaded into the substrate processing apparatus 4 by an in-process transfer device (an inter-process transfer device) located outside the substrate processing apparatus 4 on the AGV port 22, and is unloaded from the AGV port 22.

Upper and lower storage shelves (pod shelves) 30A for storing the pod 20 are installed in two stages above the AGV port 22 on the front side in the housing of the accommodating chamber 12. Storage shelves (pod shelves) 30B for storing the pod 20 are installed in a matrix form on a rear side in the housing of the accommodating chamber 12.

OHT ports 32 are laterally installed side by side in the horizontal direction on the same straight line of the accommodation shelves 30A at an upper end in front of the housing. The pod 20 is loaded into the OHT ports 32 from the portion above the substrate processing apparatus 4 by the in-process transfer device (the inter-process transfer device) located outside the substrate processing apparatus 4, and is unloaded through the portion above the OHT ports 32. The AGV port 22, the storage shelves 30A and the OHT ports 32 are configured such that the pod 20 can be horizontally moved to a loading position and a transfer position by the horizontal driving mechanism 26. A detailed description of the horizontal driving mechanism 26 will be described hereinbelow.

Figure 2:
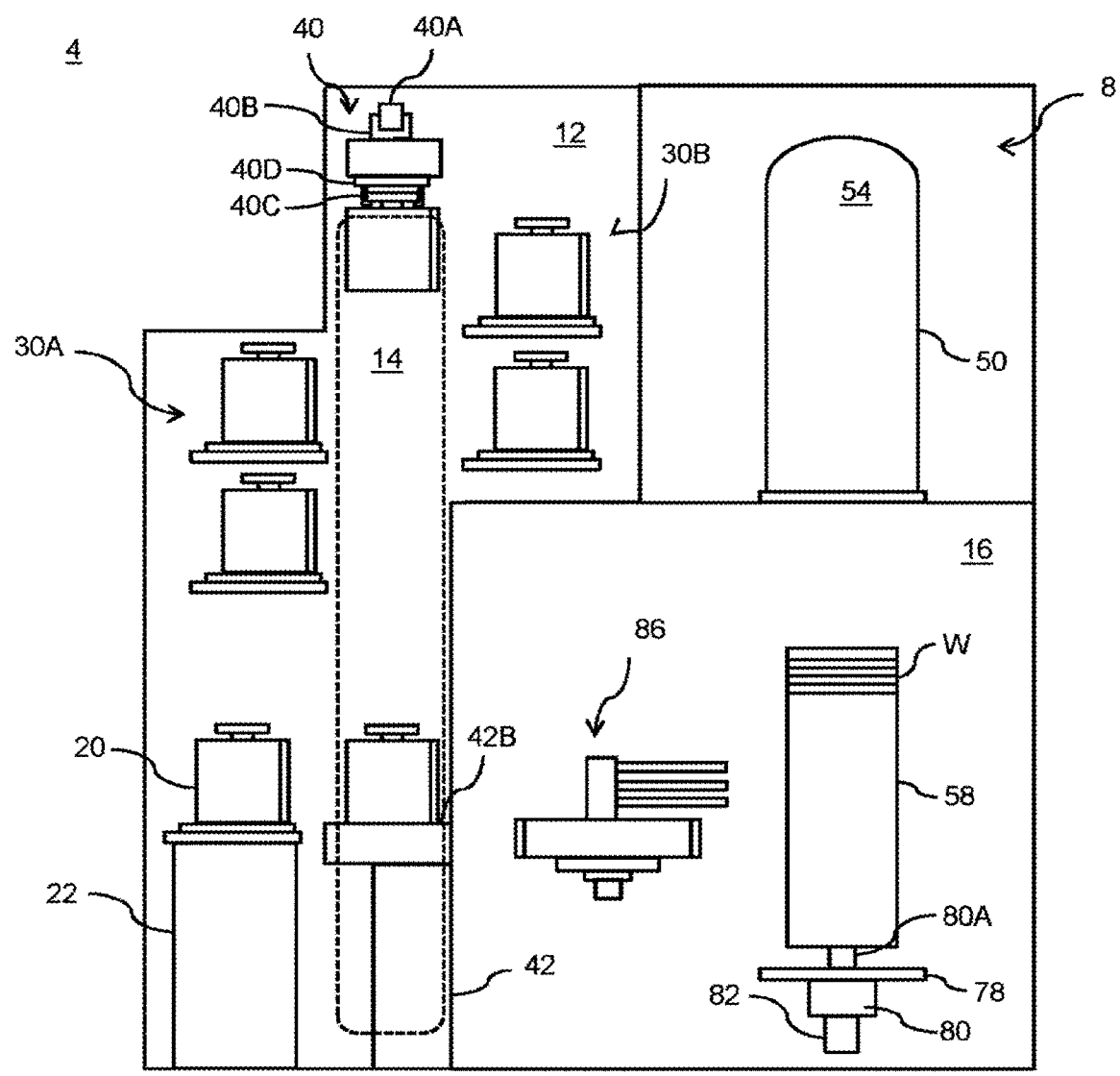
FIG. 2 is a cross sectional view of a substrate processing apparatus that is suitably used in the first embodiment of the present disclosure.
Figure 3:
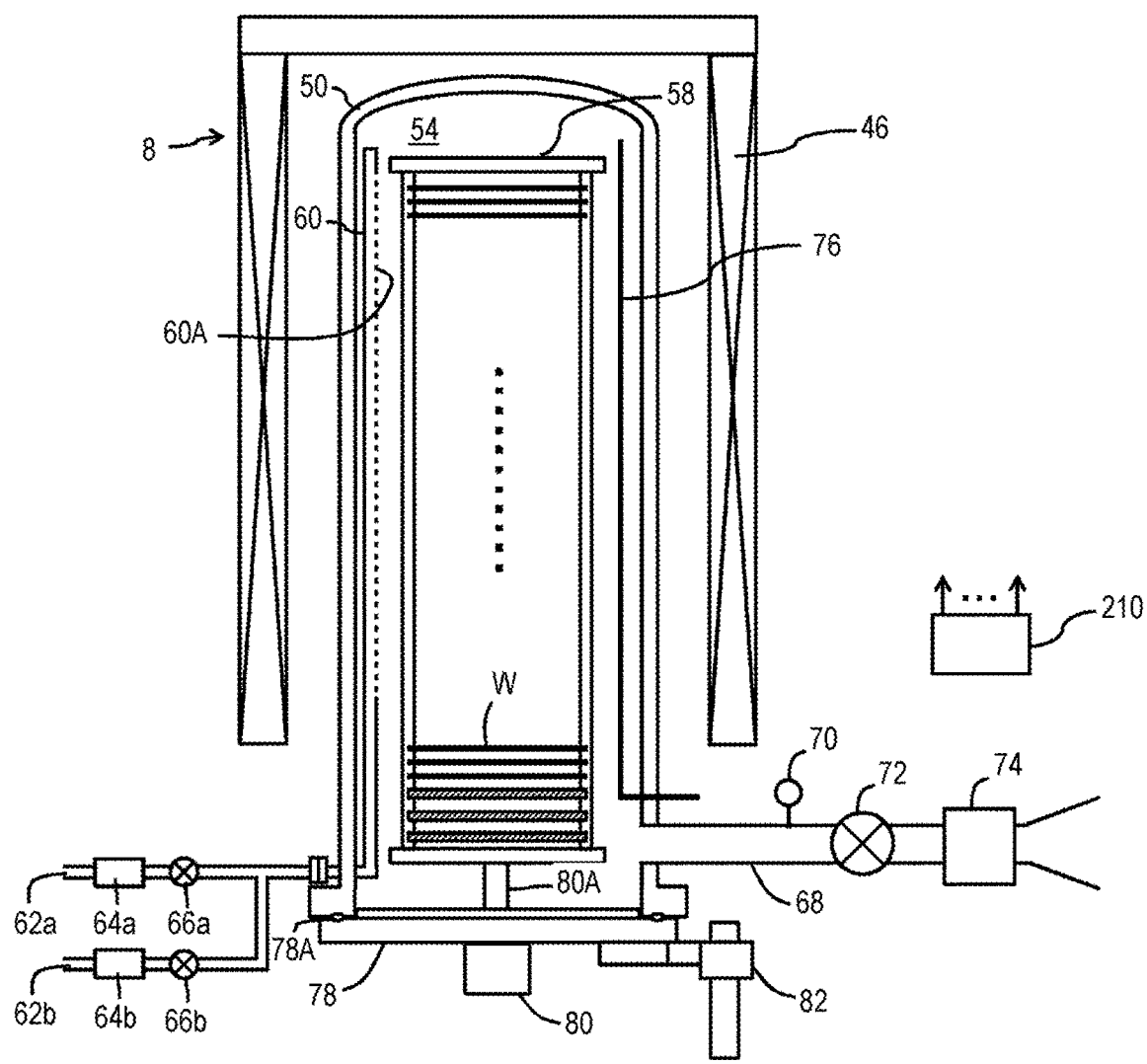
FIG. 3 is a schematic configuration diagram of a vertical type processing furnace of the substrate processing apparatus that is suitably used in the first embodiment of the present disclosure, in which a portion of the processing furnace is shown in a vertical cross sectional view.

As illustrated in FIG. 2, the space between the storage shelves 30A on the front side in the housing of the accommodating chamber 12 and the storage shelves 30B on the rear side forms a pod transfer region 14, and the pod 20 is delivered and transferred in the pod transfer region 14. A rail mechanism 40A as a traveling path of a pod transfer mechanism 40 as described hereinbelow is formed in a ceiling part of the pod transfer region 14 (a ceiling part of the accommodating chamber 12). Here, the transfer position is located in the pod transfer region 14, and is, for example, a position immediately below the pod transfer mechanism 40.

The pod transfer mechanism 40 for transferring the pod 20 includes a traveling portion 40B that travels along the traveling path, a holding portion 40C for holding the pod 20, and an elevating portion 40D for vertically moving the holding portion 40C up and down. A position of the traveling portion 40B on the traveling path can be detected by detecting an encoder of a motor that drives the traveling portion 40B. Thus, it is possible to move the traveling portion 40B to an arbitrary position.

(Transfer Chamber)

The transfer chamber 16 is configured to be adjacent to the rear of the accommodating chamber 12. A plurality of wafer loading/unloading ports for loading and unloading the wafer W into and from the transfer chamber 16 is installed side by side in the horizontal direction on the transfer chamber 16 side of the accommodating chamber 12, and load ports 42 are installed in the wafer loading/unloading ports, respectively. The load ports 42 horizontally move a loading table 42B on which the pod 20 is loaded and push it to the wafer loading/unloading ports to unfold a lid of the pod 20. When the lid of the pod 20 is unfolded, the transfer of the substrate W into and out of the pod 20 is performed by a substrate transfer device 86.

(Processing Furnace)

A processing furnace 8 is installed above the transfer chamber 16. As illustrated in FIG. 3, the processing furnace 8 has a heater 46 as a heating means (heating mechanism). The heater 46 has a cylindrical shape and is supported by a heater base (not shown) serving as a retaining plate so as to be vertically installed. As will be described hereinbelow, the heater 46 functions as an activation mechanism (an excitation part) configured to thermally activate (excite) a gas.

A reaction tube 50, which defines a reaction vessel (process vessel), is disposed inside the heater 46 to be concentric with the heater 46. The reaction tube 50 is made of a heat resistant material such as, for example, quartz ($SiO_2$), silicon carbide (SiC) or the like and has a cylindrical shape with its upper end closed and its lower end opened. A process chamber 54 is formed in a hollow cylindrical portion of the reaction tube 50. The process chamber 54 is configured to accommodate wafers W as substrates. The wafers W are horizontally stacked in multiple stages along a vertical direction in a boat 58 which will be described hereinbelow.

A nozzle 60 is installed in the process chamber 54 so as to penetrate a lower portion of the reaction tube 50. The nozzle 60 is made of a heat resistant material such as quartz or SiC. A gas supply pipe 62a is connected to the nozzle 60. A mass flow controller (MFC) 64a, which is a flow rate controller (flow rate control part), and a valve 66a, which is an opening/closing valve, are installed in the gas supply pipe 62a sequentially from an upstream side of the gas supply pipe 62a. A gas supply pipe 62b, which supplies an inert gas, is connected to the downstream side of the valve 66a of the gas supply pipe 62a. An MFC 64b and a valve 66b are installed in the gas supply pipe 62b sequentially from an upstream side of the gas supply pipe 62b. A processing gas supply part as a processing gas supply system mainly includes the gas supply pipe 62a, the MFC 64a, and the valve 66a.

The nozzle 60 is disposed in a space with an annular shape between the inner wall of the reaction tube 50 and the wafers W such that the nozzle 60 extends upward along a stacking direction of the wafers W from a lower portion of the inner wall of the reaction tube 50 to an upper portion of the inner wall of the reaction tube 50. Specifically, the nozzle 60 is installed at a lateral side of a wafer arrangement region in which the wafers W are arranged, namely in a region which horizontally surrounds the wafer arrangement region, so as to extend along the wafer arrangement region. That is, the nozzle 60 is configured as an L-shaped long nozzle. A horizontal portion of the nozzle 60 is installed to penetrate a sidewall of the lower portion of the reaction tube 50. A vertical portion of the nozzle 60 is installed to extend upward at least from one end portion of the wafer arrangement region toward the other end portion of the wafer arrangement region. Gas supply holes 60A for supplying a gas are formed on the side surface of the nozzle 60. The gas supply holes 60A are opened toward the center of the reaction tube 50 so as to allow a gas to be supplied toward the wafers W. The gas supply holes 60A may be formed in a plural number between the lower portion of the reaction tube 50 and the upper portion of the reaction tube 50. The respective gas supply holes 60A may have the same aperture area and may be formed at the same aperture pitch.

However, the processing furnace 8 according to this embodiment is not limited to the aforementioned embodiment. For example, a manifold made of metal supporting the reaction tube 50 may be installed below the reaction tube 50, and the nozzle may be installed so as to penetrate a sidewall of the manifold. In this case, an exhaust pipe 68 as described hereinbelow may be further installed in the manifold. Even in this case, the exhaust pipe 68 may be installed below the reaction tube 50 instead of the manifold. In this manner, a furnace opening of the processing furnace 8 may be made of metal, and a nozzle or the like may be installed in the metal furnace opening.

The exhaust pipe 68 configured to exhaust the internal atmosphere of the process chamber 54 is installed in the reaction tube 50. A vacuum pump 74 as a vacuum exhaust device is connected to the exhaust pipe 68 via a pressure sensor 70 as a pressure detector (pressure detection part) which detects the internal pressure of the process chamber 54 and an auto pressure controller (APC) valve 72 as a pressure regulator (pressure regulation part). The APC valve 72 is a valve configured so that the vacuum exhaust of the interior of the process chamber 54 and the vacuum exhaust stop can be performed by opening and closing the APC valve 72 while operating the vacuum pump 74 and so that the internal pressure of the process chamber 54 can be adjusted by adjusting the opening degree of the APC valve 72 based on the pressure information detected by the pressure sensor 70 while operating the vacuum pump 74. An exhaust system mainly includes the exhaust pipe 68, the APC valve 72 and the pressure sensor 70. The vacuum pump 74 may be regarded as being included in the exhaust system.

A temperature detection part 76 serving as a temperature detector is installed in the reaction tube 50. Based on temperature information detected by the temperature detection part 76, a state of supplying electric power to the heater 46 is adjusted such that the interior of the process chamber 54 has a desired temperature distribution. Similar to the nozzle 60, the temperature detection part 76 is formed in an L shape. The temperature detection part 76 is installed along the inner wall of the reaction tube 50.

A seal cap 78, which serves as a furnace opening cover configured to hermetically seal a lower end opening of the reaction tube 50, is installed under the reaction tube 50. The seal cap 78 is made of metal such as, for example, stainless steel (SUS) or the like, and is formed in a disc shape. An O-ring 78A, which is a seal member making contact with the lower end portion of the reaction tube 50, is installed on an upper surface of the seal cap 78. A seal cap plate 78B for protecting the seal cap 78 is installed on the upper surface of the seal cap 78 and inside the O-ring 78A. The seal cap plate 78B is made of a heat resistant material such as, for example, quartz or SiC, and is formed in a disc shape. The seal cap 78 is configured to make contact with the lower end portion of the reaction tube 50 at a lower side of the seal cap 78 in the vertical direction.

A boat 58 serving as a substrate support is configured to support a plurality of wafers W, e.g., 25 to 200 wafers, in such a state that the wafers W are arranged in a horizontal posture and in multiple stages along a vertical direction with the centers of the wafers W aligned with one another. That is, the boat 58 is configured to arrange the wafers W in a spaced-apart relationship. The boat 58 is made of a heat resistant material such as, for example, quartz or SiC.

A rotation mechanism 80 configured to rotate the boat 58 is installed at the opposite side of the seal cap 78 from the process chamber 54. A rotary shaft 80A of the rotation mechanism 80, which penetrates the seal cap 78, is connected to the boat 58. The rotation mechanism 80 is configured to rotate the wafers W by rotating the boat 58.

Figure 5:
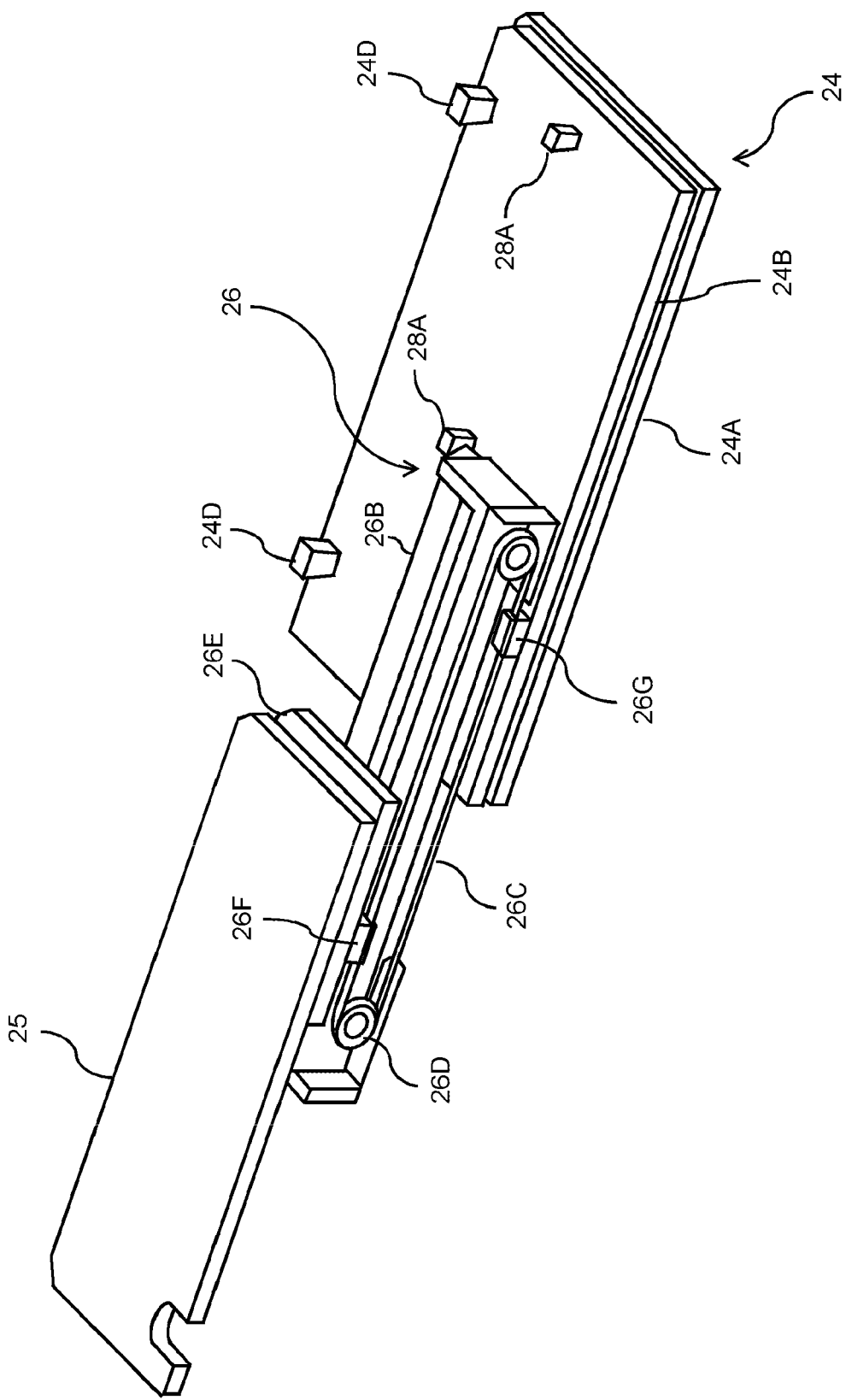
FIG. 5 is a cross sectional view of a horizontal driving mechanism that is suitably used in the first embodiment of the present disclosure.

Next, the storage shelves 30A, the AGV port 22, and the horizontal driving mechanism 26 of the OHT ports 32 according to this embodiment will be described with reference to FIGS. 5 to 9. As illustrated in FIG. 5, the horizontal driving mechanism 26 is installed on a base 24 so that a stage 25, which is a loading part for loading the pod 20, can be horizontally moved.

The base 24 includes a fixing plate 24A, an adjustment plate 24B, a fixing screw 24C and an adjusting screw 24D. The fixing plate 24A and the adjustment plate 24B are connected by a plurality of adjusters. The adjusters include a fixing screw 24C serving as a fastening member for fixing the fixing plate 24A and the adjustment plate 24B and two adjusting screws 24D serving as a horizontal adjustment member installed at a position facing the fixing screw 24C. By adjusting the fastening state of the adjusting screws 24D, it is possible to adjust the horizontality of the stage 25.

Figure 6:
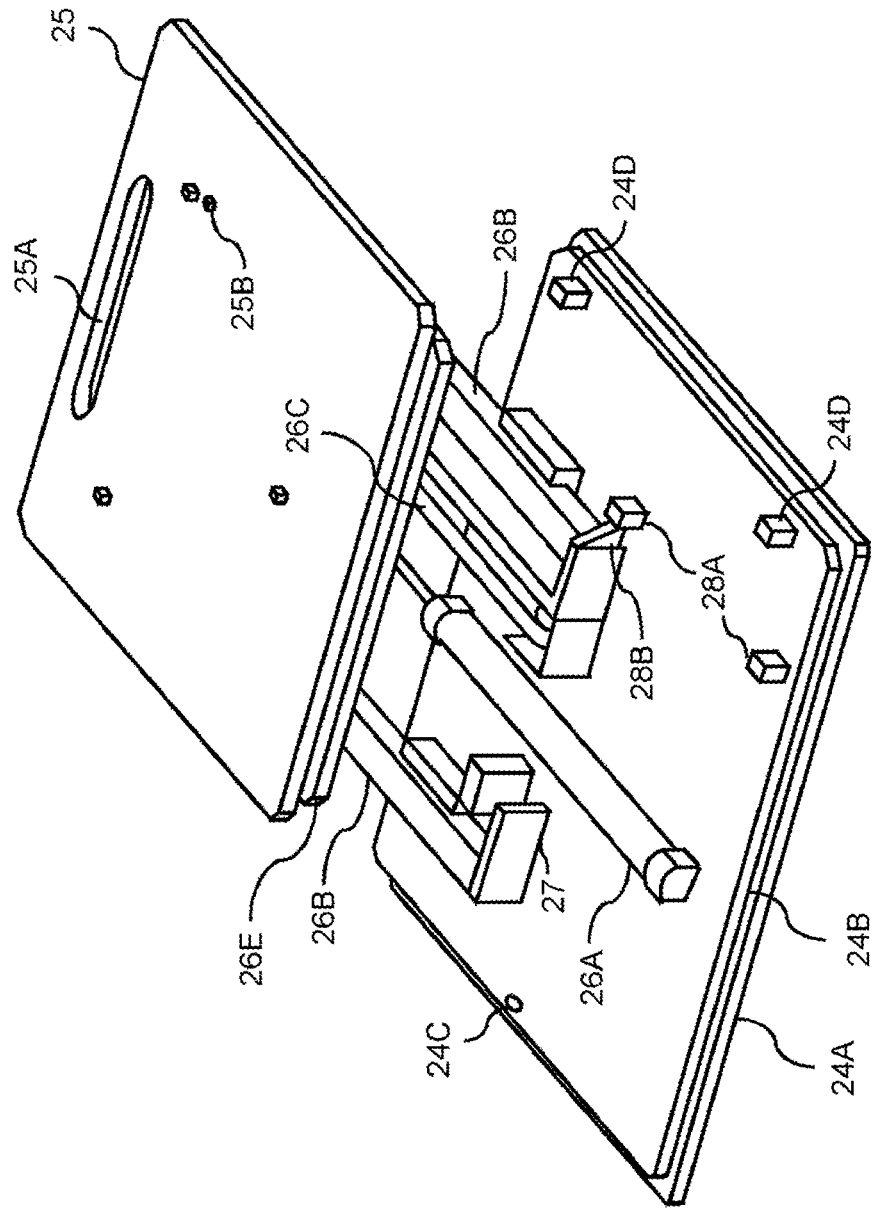
FIG. 6 is a top view of the horizontal driving mechanism that is suitably used in the first embodiment of the present disclosure.
Figure 7:
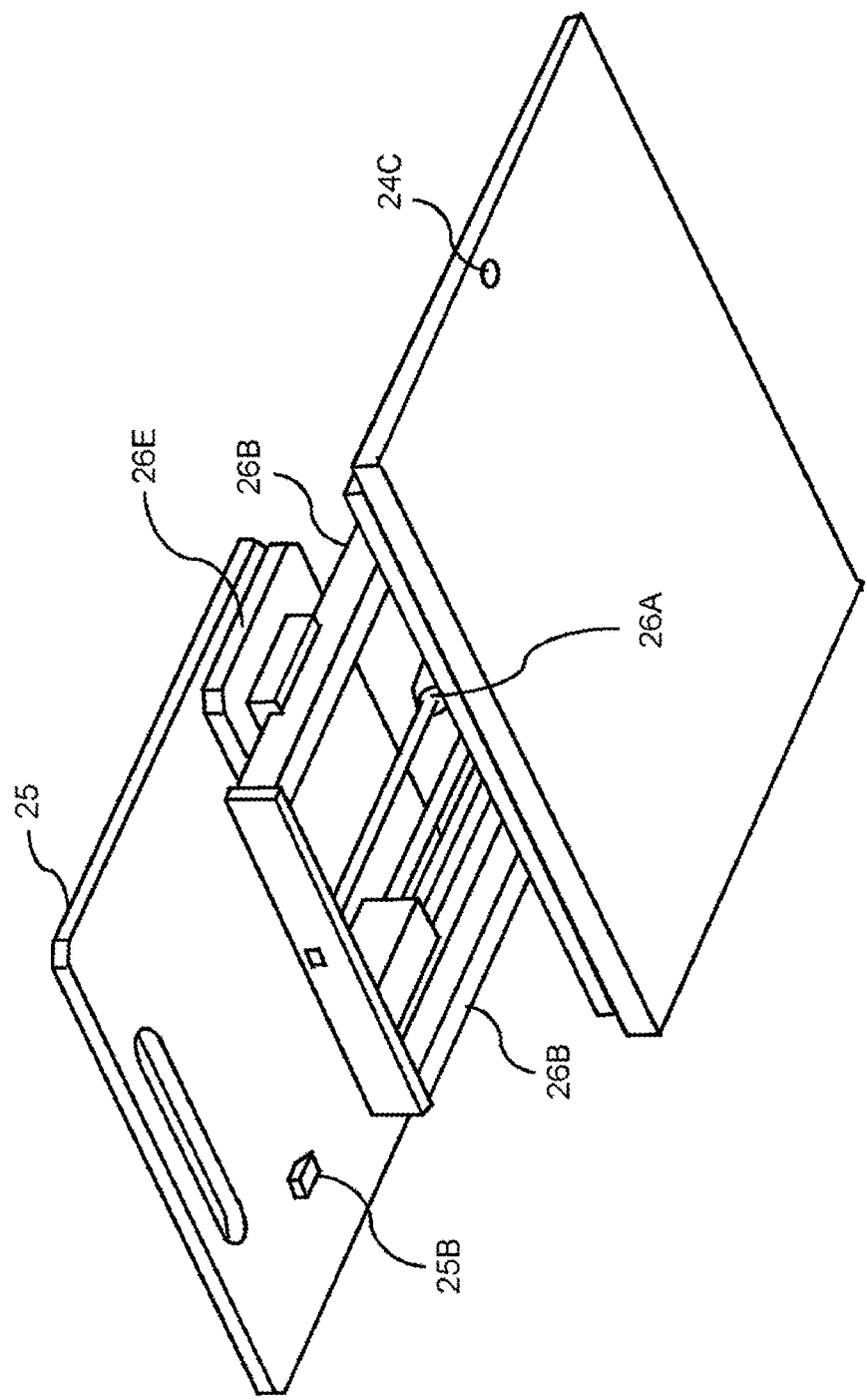
FIG. 7 is a rear view of the horizontal driving mechanism that is suitably used in the first embodiment of the present disclosure.

As illustrated in FIGS. 5 and 6, the horizontal driving mechanism 26 includes a first driving part 26A as a driving part for horizontally moving the stage 25, a pair of guide parts 26B for moving the stage 25 in parallel, a transfer portion (belt) 26C for transferring power of the first driving part 26A, a pulley 26D as a rotation member installed inside one guide parts 26B to rotate the transfer portion 26C, a flat-shaped connection member (plate) 26E connected to a lower portion of the stage 25, a fixing portion 26F for fixing the connection member 26E and the transfer portion 26C, and a fixing portion 26G for fixing the transfer portion 26C and the adjustment plate 24B. The first driving part 26A is, for example, an air cylinder or a motor. As illustrated in FIG. 7, the leading ends of the guide parts 26B are connected to each other (for, example, via a connection portion that is interposed between the leading ends of the guide parts 26B and arranged to be perpendicular to the guide parts 26B). The first driving part 26A is installed substantially at the center between the guide parts 26B so as to press the connection portion of the guide parts 26B with a rod.

As illustrated in FIG. 5, the transfer portion 26C is configured as an endless band-shaped member and spans the pulley 26D. The transfer portion 26C and the connection member 26E are fixed by the block-shaped fixing portion 26F and the transfer portion 26C and the adjustment plate 24B are fixed by a block-shaped fixing portion 26G. Since the fixing portion 26G is fixed to the adjustment plate 24B, the transfer portion 26C can be rotated when the guide parts 26B move. The stage 25 fixed to the connection member 26E can be horizontally moved by the rotation of the transfer portion 26C. With this configuration, two horizontal movement operations, namely the horizontal movement of the stage 25 by the guide parts 26B and the horizontal movement of the stage 25 by the transfer portion 26C, can be performed simultaneously. In addition, since the stage 25 can be horizontally moved in two stages, the rod of the first driving part 26A is not elongated, thereby promoting the space saving.

Two position sensors 28A are installed outside the guide parts 26B on the adjustment plate 24B. Each of the position sensors 28A includes, for example, a photosensor. The two position sensors 28A are installed to detect the loading position and the transfer position of the stage 25, respectively. A thin plate-shaped detection member 28B for detecting the position sensors 28A is installed at the rear end of the guide parts 26B on the sides where the position sensors 28A are installed. The position of the stage 25 is detected by the detection member 28B passing through the detection portion of the position sensors 28A. By adjusting the installation position of the position sensors 28A, the stage 25 can be driven with an arbitrary stroke, thereby improving the controllability. A stopper 27 is installed at the end portion of the guide parts 26B on the sides where the detection member 28B is not installed.

Figure 9:
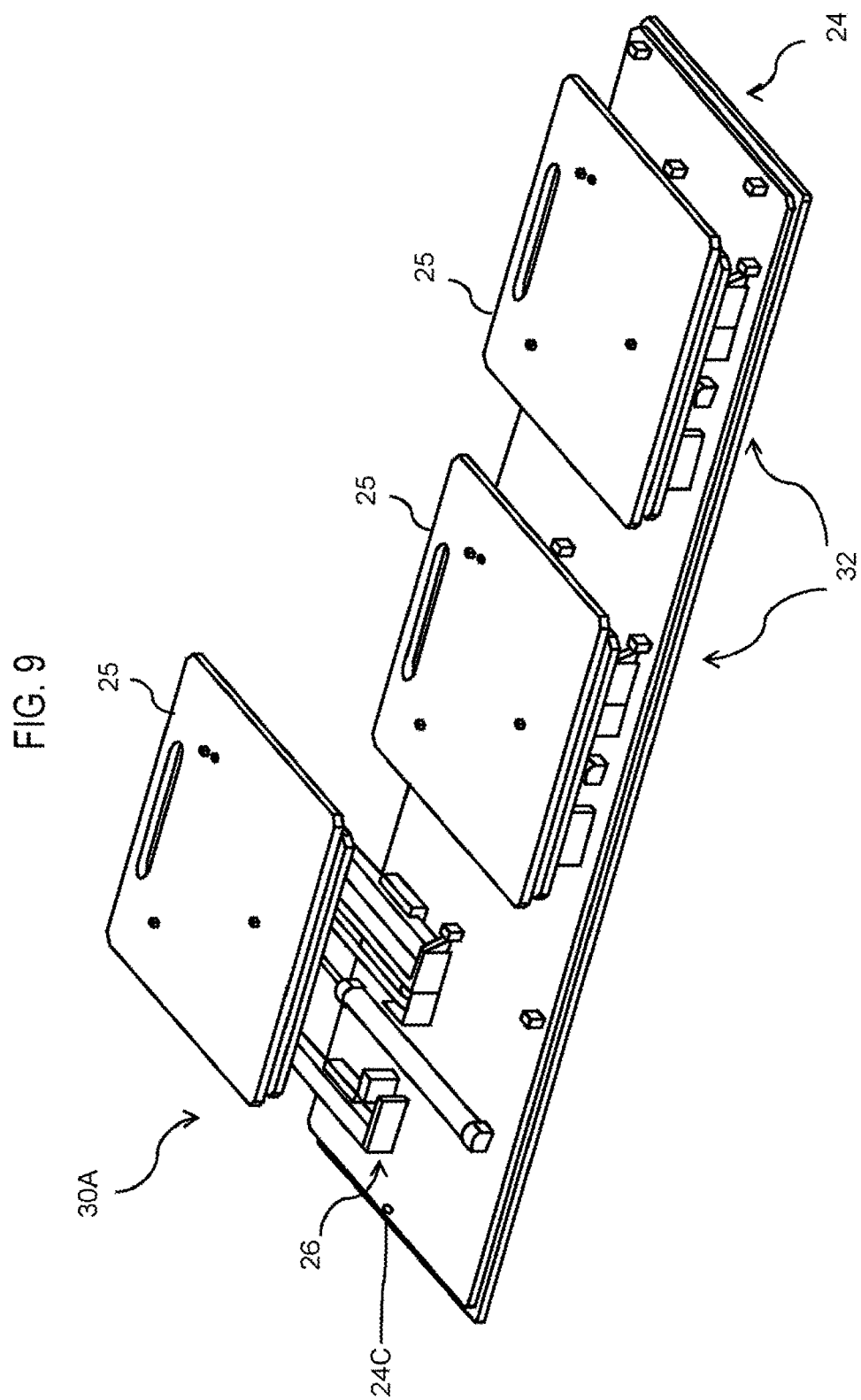
FIG. 9 is a top view of the storage shelf that is suitably used in the first embodiment of the present disclosure.

A pod sensor 25B for detecting whether or not the pod 20 is loaded is installed in the stage 25. The pod sensor 25B includes, for example, a photosensor. When the pod 20 is loaded, a pin is pressed by the bottom surface of the pod 20 and the pressed pin passes through the detection portion of the pod sensor 25B. Thus, it can be detected that the pod 20 is loaded. An opening 25A is formed at a leading end of the stage 25, so that it is possible to carry the stage 25 with the opening 25A as a handle at the time of maintenance. With this configuration, it is possible to improve the maintenance characteristics. As illustrated in FIG. 9, in the front of the housing, the storage shelves 30A and the OHT ports 32 are installed so as to be independently driven on the long base 24, respectively.

Figure 8:
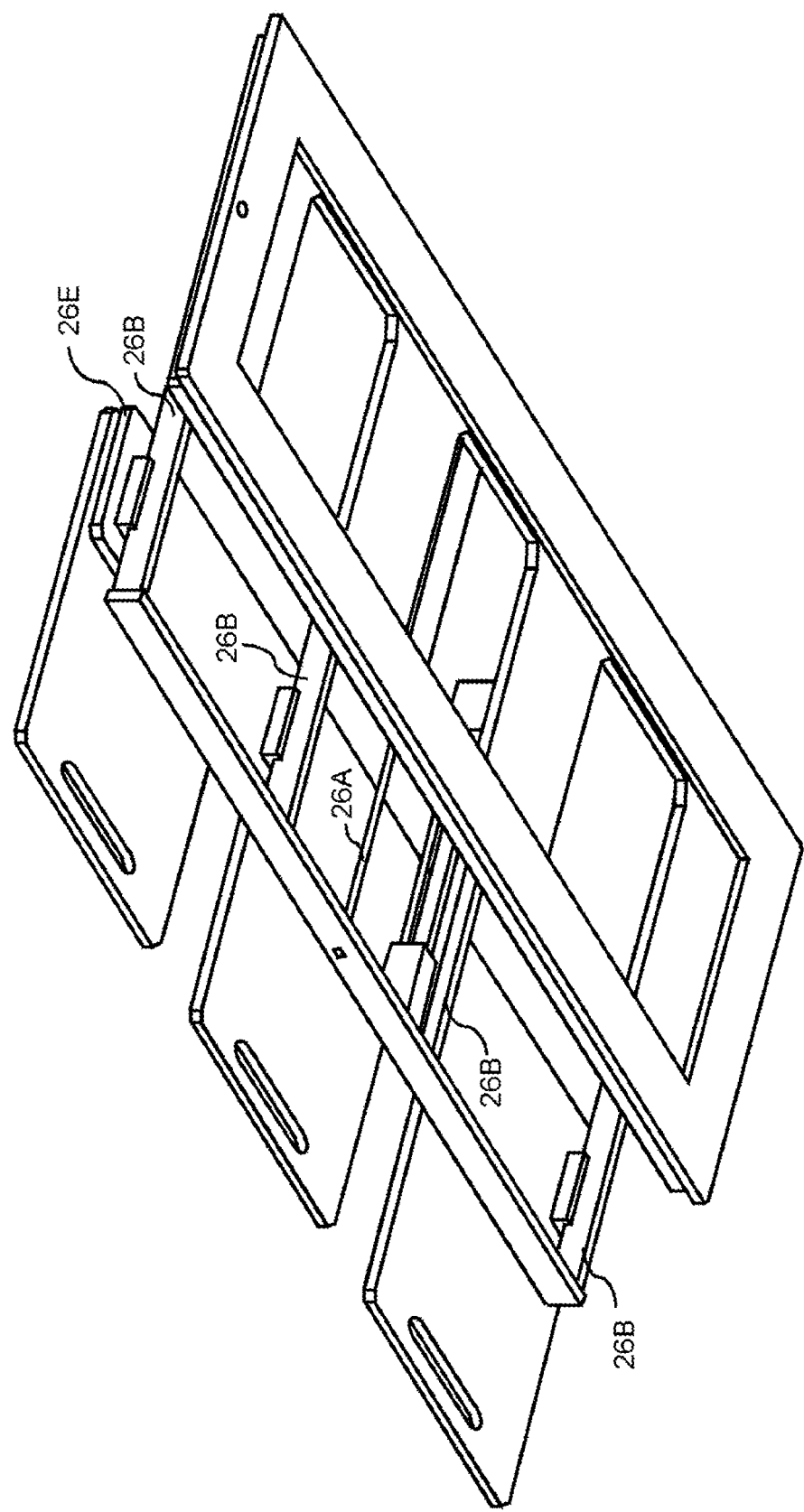
FIG. 8 is a rear view of a storage shelf that is suitably used in the first embodiment of the present disclosure.

Next, the horizontal driving mechanism 26 of the storage shelves 30B according to this embodiment will be described with reference to FIG. 8. A difference among the storage shelves 30A, the AGV port 22 and the horizontal driving mechanism 26 of the OHT ports 32 is that a plurality of stages 25 is connected and integrally driven. Specifically, the stages 25 are installed by laterally extending the connection member 26E of the horizontal driving mechanism 26 to horizontally elongate the same. One guide part 26B is arranged at each end of the short side of the connection member 26E. That is, four guide parts 26B are installed for three stages 25. With this configuration, it is possible to integrally drive the stages 25 by one first driving part 26A.

Figure 4:
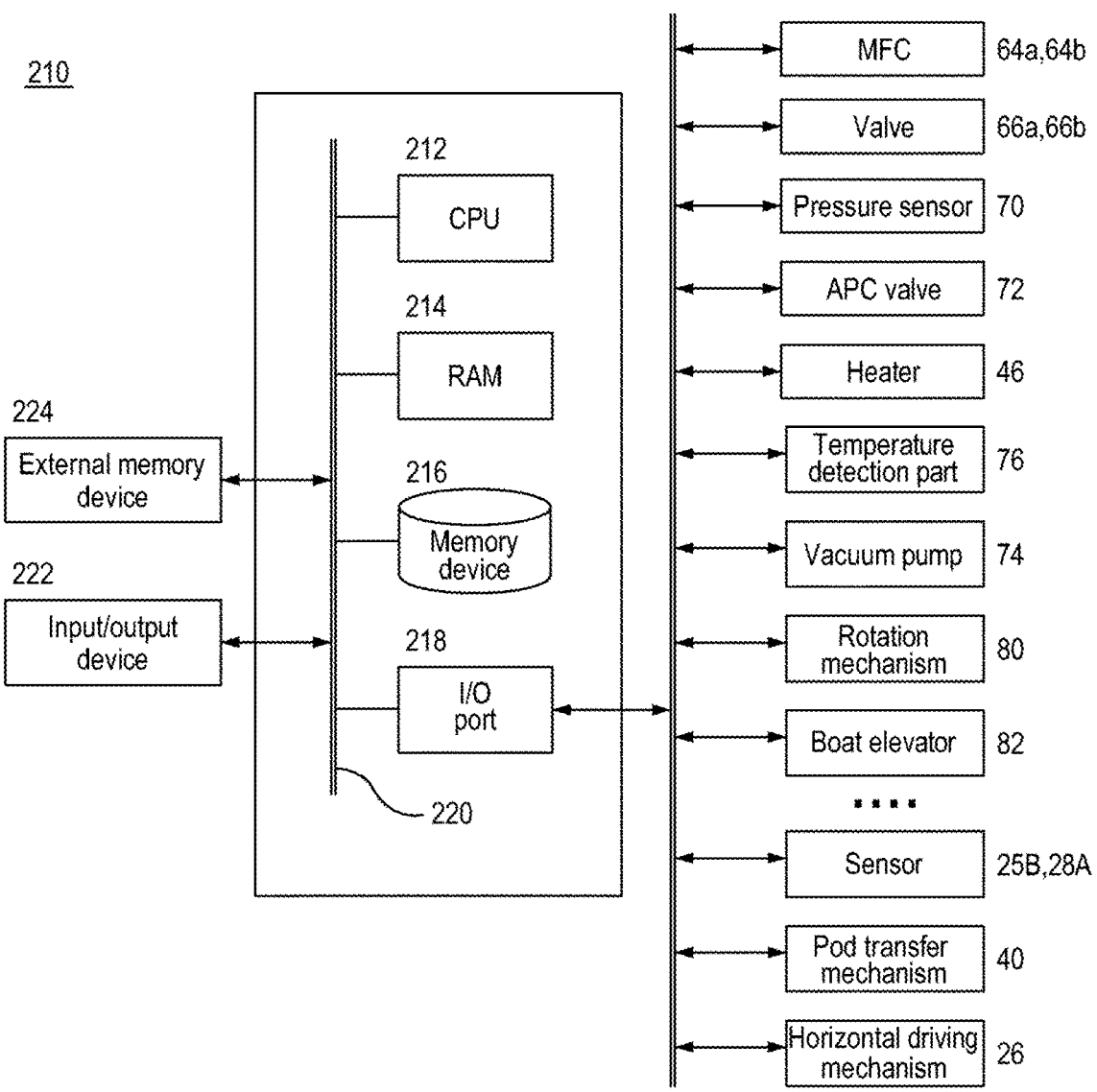
FIG. 4 is a schematic configuration diagram of a controller of the substrate processing apparatus that is suitably used in the first embodiment of the present disclosure, in which a control system of the controller is shown in a block diagram.

As illustrated in FIG. 4, a controller 210, which is a control part (control means), may be configured as a computer including a central processing unit (CPU) 212, a random access memory (RAM) 214, a memory device 216, and an I/O port 218. The RAM 214, the memory device 216 and the I/O port 218 are configured to exchange the data with the CPU 212 via an internal bus 220. An input/output device 222 formed of, e.g., a touch panel or the like, is connected to the controller 210.

The memory device 216 includes, for example, a flash memory, a hard disk drive (HDD), or the like. A control program for controlling operations of a substrate processing apparatus, a process recipe for specifying sequences and conditions of substrate processing as described hereinbelow, or the like is readably stored in the memory device 216. The process recipe functions as a program for causing the controller 210 to execute each sequence in a substrate processing process, as described hereinbelow, to obtain a predetermined result. Hereinafter, the process recipe and the control program will be generally and simply referred to as a "program." When the term "program" is used herein, it may indicate a case of including only the process recipe, a case of including only the control program, or a case of including both the process recipe and the control program. The RAM 214 is configured as a memory area (work area) in which a program or data read by the CPU 212 is temporarily stored.

The I/O port 218 is connected to the MFCs 64a and 64b, the valves 66a and 66b, the pressure sensor 70, the APC valve 72, the heater 46, the temperature detection part 76, the vacuum pump 74, the rotation mechanism 80, the boat elevator 82, the pod transfer mechanism 40, the sensors 25B and 28A, the horizontal driving mechanism 26, and the like, as described above.

The CPU 212 is configured to read the control program from the memory device 216 and execute the same. The CPU 212 also reads the process recipe from the memory device 216 according to an input of an operation command from the input/output device 222. In addition, the CPU 212 is configured to control, according to the contents of the process recipe thus read, the flow rate adjusting operation of various kinds of gases by the MFCs 64a and 64b, the opening/closing operation of the valves 66a and 66b, the opening/closing operation of the APC valve 72, the pressure regulating operation performed by the APC valve 72 based on the pressure sensor 70, the driving and stopping of the vacuum pump 74, the temperature adjusting operation performed by the heater 46 and a sub heater based on the temperature detection part 76, the operation of rotating the boat 58 with the rotation mechanism 80 and adjusting the rotation speed of the boat 58, the operation of moving the boat 58 up and down with the boat elevator 82, the pod transfer operation by the pod transfer mechanism 40, the driving operation of the horizontal driving mechanism 26 based on the sensors 25B and 28A, and the like.

The controller 210 may be configured by installing, on the computer, the aforementioned program stored in an external memory device 224 (for example, a magnetic tape, a magnetic disk such as a flexible disk or a hard disk, an optical disc such as a CD or DVD, a magneto-optical disc such as an MO, or a semiconductor memory such as a USB memory or a memory card). The memory device 216 or the external memory device 224 is configured as a non-transitory computer-readable recording medium. Hereinafter, the memory device 216 and the external memory device 224 will be generally and simply referred to as a "recording medium." When the term "recording medium" is used herein, it may indicate a case of including only the memory device 216, a case of including only the external memory device 224, or a case of including both the memory device 216 and the external memory device 224. Furthermore, the program may be supplied to the computer using a communication means such as the Internet or a dedicated line, instead of using the external memory device 224.

Next, the transfer of the pod 20 using the aforementioned substrate processing apparatus 4 will be described. When the pod 20 is supplied to the AGV port 22 or the OHT ports 32, the pod 20 on the AGV port 22 or the OHT ports 32 is loaded into the substrate processing apparatus 4. The loaded pod 20 is automatically transferred and delivered to the specified stage 25 of the storage shelves 30 by the pod transfer mechanism 40 and temporarily stored, and then transferred and delivered from the storage shelves 30 to one load port 42, or directly transferred to the load port 42.

The pod transfer mechanism 40 is moved to above the transfer position of the stage 25 of the AGV port 22, on which the pod 20 to be transferred is loaded, by controlling the traveling portion 40B. Here, the phrase "above the transfer position" may indicate a position where the pod transfer mechanism 40 can hold the pod 20 by lowering the holding portion 40C by the elevating portion 40D, namely a position where the holding portion 40C is located immediately above the pod 20.

It is checked that the pod transfer mechanism 40 is waiting above the transfer position, and the stage 25 of the AGV port 22 on which the pod 20 to be unloaded is loaded is horizontally moved (slid) to the transfer position. Here, the sliding operation of the AGV port 22 and the driving of the pod transfer mechanism 40 may be performed at the same time.

It is checked by the sensor 28A that the stage 25 has been slid to the transfer position, and the holding portion 40C is then lowered to a position where the pod 20 can be held by controlling the elevating portion 40D, and the pod 20 is held by controlling the holding portion 40C. It is checked that the holding portion 40C holds the pod 20, and the holding portion 40C is raised by controlling the elevating portion 40D.

It is checked by the sensor 25B of the stage 25 that the pod 20 is not loaded on the stage 25, and the stage 25 is then slid to the loading position. It is checked by the sensor 28A that the stage 25 is returned to the loading position, and the pod transfer mechanism 40 is then moved to above the transfer position of the load port 42 or the storage shelves 30 to be transferred. When transferred to the load port 42, the pod transfer mechanism 40 is moved above the loading portion of the load port 42 and the holding portion 40C is then lowered by controlling the elevating portion 40D so that the pod 20 is loaded in the loading portion of the load port 42. The loading portion of the load port 42 is located immediately below the pod transfer mechanism 40, and thus, it does not need to be horizontally moved for transfer. When transferred to the storage shelves 30, the stage 25 of the storage shelves 30 of the transfer destination is horizontally moved (slid) to the transfer position and it is checked by the sensor 28A that the stage 25 has been slid to the transfer position, and the holding portion 40C is then lowered by controlling the elevating portion 40D so that the pod 20 is loaded on the stage 25. Here, the sliding operation of the stage 25 of the storage shelves 30 and the driving of the pod transfer mechanism 40 may be performed at the same time.

Next, a sequence example of a process of forming a film on a substrate (hereinafter, also referred to as a film forming process) using the aforementioned substrate processing apparatus 4, which is one of the processes for manufacturing a semiconductor device, will be described below. Here, an example in which a film is formed on a wafer W by alternately supplying a first processing gas (precursor gas) and a second processing gas (reaction gas) to a wafer W as a substrate will be described.

Hereinafter, an example in which a silicon nitride film ($Si_3N_4$ film, hereinafter also referred to as an SiN film) is formed on the wafer W by using a hexachlorodisilane ($Si_2Cl_6$, abbreviation: HCDS) gas as a precursor gas and an ammonia ($NH_3$) gas as a reaction gas will be described. In the following descriptions, the operations of the respective parts constituting the substrate processing apparatus 4 are controlled by the controller 210.

In the film forming process according to this embodiment, an SiN film is formed on the wafer W by implementing, a predetermined number of times (one or more times), a cycle which non-simultaneously performs a step of supplying an HCDS gas to a wafer W in the process chamber 54, a step of removing the HCDS gas (residual gas) from the interior of the process chamber 54, a step of supplying an $NH_3$ gas to the wafer W in the process chamber 54, and a step of removing the $NH_3$ gas (residual gas) from the interior of the process chamber 54.

In the present disclosure, for the sake of convenience, the film forming sequence may be denoted as follows. The same denotation will be used in the modifications and other embodiments as described hereinbelow.

(HCDS→$NH_3$)×n⇒SiN

When the term "wafer" is used herein, it may refer to "a wafer itself" or "a laminated body (aggregate) of a wafer and a predetermined layer or film formed on the surface of the wafer." That is, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body."

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer."

(Wafer Charging and Boat Loading)

If a plurality of wafers W is charged on the boat 58 (wafer charging), the boat 58 is loaded into the process chamber 54 by the boat elevator 82 (boat loading). In this state, the seal cap 78 hermetically seals the lower end of the reaction tube 50 through the O-ring 78A.

(Pressure Regulation and Temperature Adjustment)

The interior of the process chamber 54, namely the space in which the wafers W are located, is vacuum-exhausted (depressurization-exhausted) by the vacuum pump 74 so as to reach a desired pressure (degree of vacuum). In this operation, the internal pressure of the process chamber 54 is measured by the pressure sensor 70. The APC valve 72 is feedback-controlled based on the measured pressure information. The vacuum pump 74 may be continuously activated at least until the processing of the wafers W is completed.

The wafers W in the process chamber 54 are heated by the heater 46 to a desired temperature. In this operation, the state of supplying electric power to the heater 46 is feedback-controlled based on the temperature information detected by the temperature detection part 76 such that the interior of the process chamber 54 has a desired temperature distribution. In addition, the heating of the interior of the process chamber 54 by the heater 46 may be continuously performed at least until the processing of the wafers W is completed.

The rotation of the boat 58 and the wafers W by the rotation mechanism 80 begins. The boat 58 is rotated by the rotation mechanism 80 so that the wafers W are rotated. The rotation of the boat 58 and the wafers W by the rotation mechanism 80 may be continuously performed at least until the processing of the wafers W is completed.

(Film Forming Process)

When the internal temperature of the process chamber 54 is stabilized at a predetermined processing temperature, the following two steps, i.e., steps 1 and 2, are sequentially performed.

[Step 1]

At this step, an HCDS gas is supplied to the wafer W within the process chamber 54.

Specifically, the valve 66a is opened to allow an HCDS gas to flow through the gas supply pipe 62a. The flow rate of the HCDS gas is adjusted by the MFC 64a. The HCDS gas is supplied into the process chamber 54 via the nozzle 60 and is exhausted from the exhaust pipe 68. At this time, the HCDS gas is supplied to the wafer W. Simultaneously, the valve 66b is opened to allow an $N_2$ gas to flow through the gas supply pipe 62b. The flow rate of the $N_2$ gas is adjusted by the MFC 64b. The $N_2$ gas is supplied into the process chamber 54 together with the HCDS gas and is exhausted from the exhaust pipe 68. By supplying the HCDS gas to the wafer W, a silicon (Si)-containing layer having a thickness of, for example, less than one atomic layer to several atomic layers is formed as a first layer on the outermost surface of the wafer W.

After the first layer is formed, the valve 66a is closed to stop the supply of the HCDS gas. At this time, the interior of the process chamber 54 is vacuum-exhausted by the vacuum pump 74 while opening the APC valve 72. Thus, the unreacted HCDS gas or the HCDS gas contributed to the formation of the first layer, which remains within the process chamber 54, is removed from the interior of the process chamber 54. Furthermore, the supply of the $N_2$ gas into the process chamber 54 is maintained while opening the valve 66b. The $N_2$ gas acts as a purge gas. This makes it possible to enhance the effect of removing the gas, which remains within the process chamber 54, from the interior of the process chamber 54.

At this time, the gas remaining within the process chamber 54 may not be completely removed and the interior of the process chamber 54 may not be completely purged. If the amount of the gas remaining within the process chamber 54 is small, there is no possibility that an adverse effect is generated at step 2 which will be performed later. In this case, it is not necessary to make the flow rate of the $N_2$ gas supplied into the process chamber 54 large. For example, by supplying the $N_2$ gas substantially in the same amount as the volume of the reaction tube 50 (the process chamber 54), it is possible to perform a purge operation such that an adverse effect is not generated at step 2. By not completely purging the interior of the process chamber 54 in this way, it is possible to shorten the purge time and to improve the throughput. In addition, it is possible to suppress the consumption of the $N_2$ gas to a necessary minimum level.

[Step 2]

After step 1 is completed, an $NH_3$ gas is supplied to the wafer W within the process chamber 54, i.e., the first layer formed on the wafer W. The $NH_3$ gas is thermally activated and supplied to the wafer W.

At this step, the opening/closing control of the valves 66a and 66b is performed in the same procedure as the opening/closing control of the valves 66a and 66b at step 1. The flow rate of the $NH_3$ gas is adjusted by the MFC 64a. The $NH_3$ gas is supplied into the process chamber 54 via the nozzle 60 and is exhausted from the exhaust pipe 68. At this time, the $NH_3$ gas is supplied to the wafer W. The $NH_3$ gas supplied to the wafer W reacts with at least part of the first layer formed on the wafer W at step 1, i.e., the Si-containing layer. Thus, the first layer can be thermally nitrided with non-plasma so as to be changed (modified) to a second layer comprising Si and N, i.e., a silicon nitride layer (SiN layer). At this time, the first layer may be changed to the second layer (SiN layer) by supplying a plasma-excited $NH_3$ gas to the wafer W and plasma-nitriding the first layer.

After the second layer is formed, the valve 66a is closed to stop the supply of the $NH_3$ gas. Then, the unreacted $NH_3$ gas, the $NH_3$ gas contributed to the formation of the second layer, or the reaction byproduct, which remains within the process chamber 54, is removed from the interior of the process chamber 54 by the same processing procedures as those of step 1. At this time, similar to step 1, the gas or the like remaining within the process chamber 54 may not be completely discharged.

(Performing a Predetermined Number of Times)

A cycle which non-simultaneously, i.e., non-synchronously, performs two steps described above is implemented a predetermined number of times (n times). Thus, an SiN film having a predetermined composition and a predetermined thickness can be formed on the wafer W. The aforementioned cycle may be repeated multiple times. That is, the thickness of the second layer (SiN layer) formed per one cycle may be set smaller than a desired thickness and the aforementioned cycle may be repeated multiple times until the thickness of the SiN film formed by laminating the second layer (SiN layer) becomes equal to the desired thickness.

The processing conditions in the film forming process are exemplified, for example, as follows:

Processing temperature (wafer temperature): 250 to 700 degrees C.

Processing pressure (internal pressure of process chamber): 1 to 4,000 Pa

Supply flow rate of HCDS gas: 1 to 2,000 sccm

Supply flow rate of $NH_3$ gas: 100 to 10,000 sccm

Supply flow rate of $N_2$ gas: 100 to 10,000 sccm.

By setting each processing condition to any value within each range, it becomes possible to appropriately perform the film forming process.

(Purge and Atmospheric Pressure Return)

After the film forming process is completed, the valve 66b is opened and the $N_2$ gas is supplied from the gas supply pipe 62b into the process chamber 54 and is exhausted from the exhaust pipe 68. The $N_2$ gas acts as a purge gas. Thus, the interior of the process chamber 54 is purged and the gas or the reaction byproduct, which remains within the process chamber 54, is removed from the interior of the process chamber 54 (purge). Thereafter, the internal atmosphere of the process chamber 54 is substituted by an inert gas (inert gas substitution). The internal pressure of the process chamber 54 is returned to an atmospheric pressure (atmospheric pressure return).

(Boat Unloading and Wafer Discharging)

The seal cap 78 is moved down by the boat elevator 82 to open the lower end of the reaction tube 50. The processed wafers W supported on the boat 58 are unloaded from the lower end of the reaction tube 50 to the outside of the reaction tube 50 (boat unloading). The processed wafers W are discharged from the boat 58 (wafer discharging).

According to the first embodiment, one or more effects as set forth below may be achieved.

(1) It is possible to save the space of the accommodating chamber and to reduce the footprint of the substrate processing apparatus.

(2) It is possible to improve the transfer speed of the storage vessel. Thus, it becomes possible to improve the throughput and the productivity.

Figure 10:
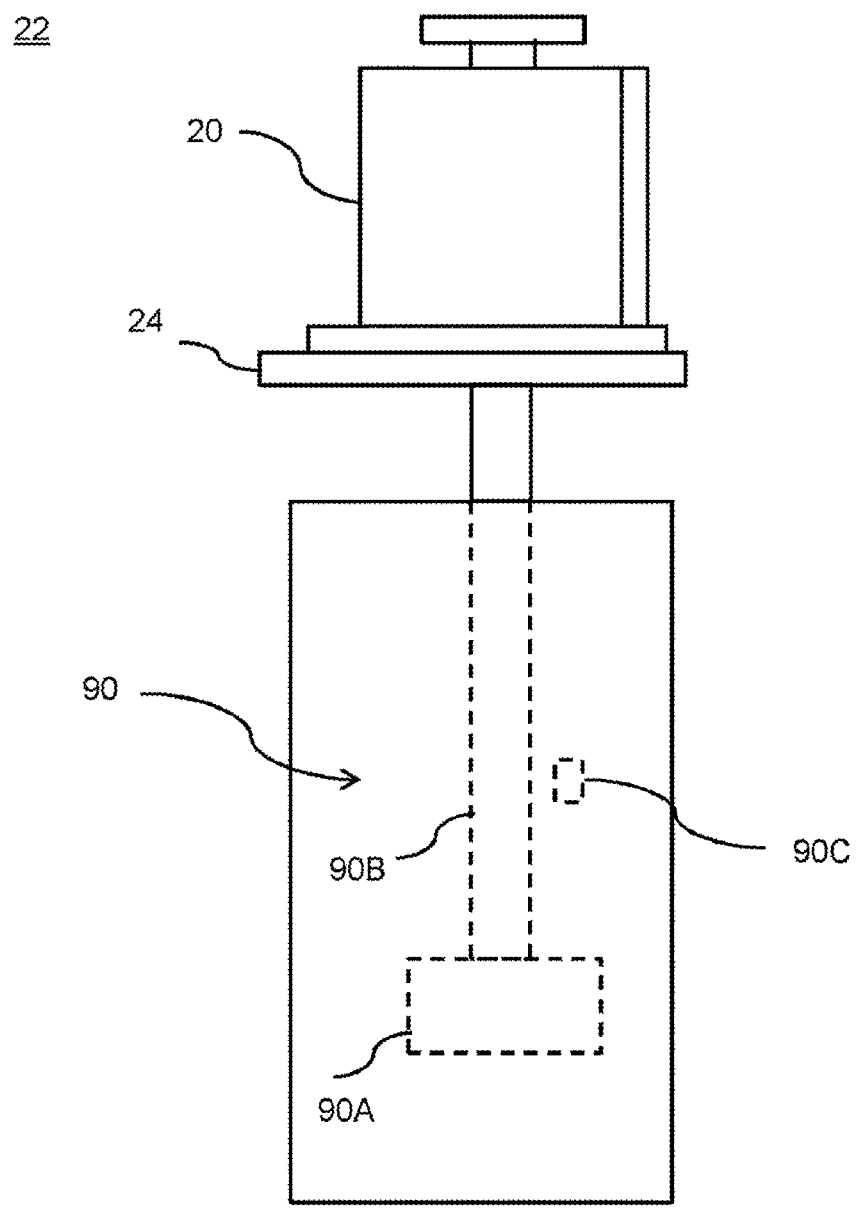
FIG. 10 is a vertical cross sectional view of an AGV port that is suitably used in a second embodiment of the present disclosure.

Next, a second embodiment will be described with reference to FIG. 10. The second embodiment is different from the aforementioned embodiment in that the AGV port 22 further includes an elevating mechanism for moving the base 24 up and down. Substantially the same elements as the elements described in the aforementioned embodiment are given the same reference numerals and a description thereof will be omitted.

An elevation driving mechanism 90 for vertically moving the pod 20 up and down is installed in the AGV port 22. The elevation driving mechanism 90 includes a second driving part 90A as a driving part that moves the stage 25 up and down, and a shaft 90B that is moved up and down by the second driving part 90A. A base 24 is horizontally installed at an upper end of the shaft 90B.

The stage 25 is raised to a plurality of predetermined height positions. When the pod 20 is loaded on a load port 42, the stage 25 is raised to a first height position which is a position above the upper surface of the pod 20. When the pod 20 is not loaded on the load port 42, the stage 25 is raised to a second height position which is a position lower than the first height position and higher than the stage of the load port 42. The height position of the stage 25 is detected by a height position sensor 90C installed around the elevation driving mechanism 90.

Subsequently, the transfer of the pod 20 in the second embodiment will be described. When the pod 20 is supplied to the AGV port 22, the pod 20 on the AGV port 22 is loaded into the substrate processing apparatus 4. The loaded pod 20 is automatically transferred and delivered to the specified stage 25 of the storage shelves 30 by the pod transfer mechanism 40 and temporarily stored, and then transferred and delivered from the storage shelves 30 to one load port 42 or directly transferred to the load port 42.

The pod transfer mechanism 40 is moved to above the transfer position of the stage 25 of the AGV port 22 on which the pod 20 to be transferred is loaded, by controlling the traveling portion 40B.

When the pod 20 is loaded on the load port 42, the stage 25 of the AGV port 22 is raised to the first height position. When the pod 20 is not loaded on the load port 42, the stage 25 of the AGV port 22 is raised to the second height position. Here, the movement of the pod transfer mechanism 40 and the raising operation of the AGV port may be performed at the same time.

It is checked that the pod transfer mechanism 40 is waiting above the transfer position and that the stage 25 of the AGV port 22 has raised to the first height position or the second height position, and the stage 25 of the AGV port 22 on which the pod 20 to be unloaded is loaded is horizontally moved (slid) to the transfer position.

After it is checked by the sensor 28A that the stage 25 has been slid to the transfer position, the holding portion 40C is lowered to a position where the pod 20 can be held by controlling the elevating portion 40D, and the pod 20 is held by controlling the holding portion 40C. It is checked that the holding portion 40C holds the pod 20, and the holding portion 40C is raised by controlling the elevating portion 40D.

After it is checked by the sensor 25B of the stage 25 that the pod 20 is not loaded, the stage 25 is slid to the loading position. After it is checked by the sensor 28A that the stage 25 is returned to the loading position, the stage 25 is lowered to the initial position (or home position). Furthermore, the pod transfer mechanism 40 is moved to above the transfer position of the load port 42 or the storage shelves 30 to be transferred. Here, the lowering of the stage 25 to the initial position and the movement of the pod transfer mechanism 40 may be performed at the same time. After the pod transfer mechanism 40 is moved to above the transfer position of the load port 42 or the storage shelves 30 to be transferred, the holding portion 40C is lowered and the pod 20 is loaded on the stage 25 to be transferred by controlling the elevating portion 40D.

It is configured such that the pod 20 can be directly transferred from the AGV port 22 to the load port 42. After it is checked that the pod 20 is not loaded on the load port 42, the stage 25 of the AGV port 22 is raised to the second height position. The stage 25 is horizontally moved (slid) to above the loading portion of the load port 42 and the stage 25 thus horizontally moved is lowered. After it is checked that the pod 20 is loaded on the load port 42, the stage 25 is horizontally moved to the loading position and lowered to the initial position.

According to the second embodiment, in addition to the effects obtained by the first embodiment, one or more effects as set forth below may be achieved.

(1) By driving the AGV port up and down, it is possible to raise the AGV port to a height position that does not interfere with the facing load port, so as to transfer the pod. This makes it possible to shorten the distance between the AGV port and the load port. Thus, it is possible to reduce the installation area of the accommodating chamber and to reduce the footprint of the apparatus.

(2) By transferring the pod directly from the AGV port to the load port, it is possible to shorten the time required for transfer and to improve the throughput.

Figure 11:
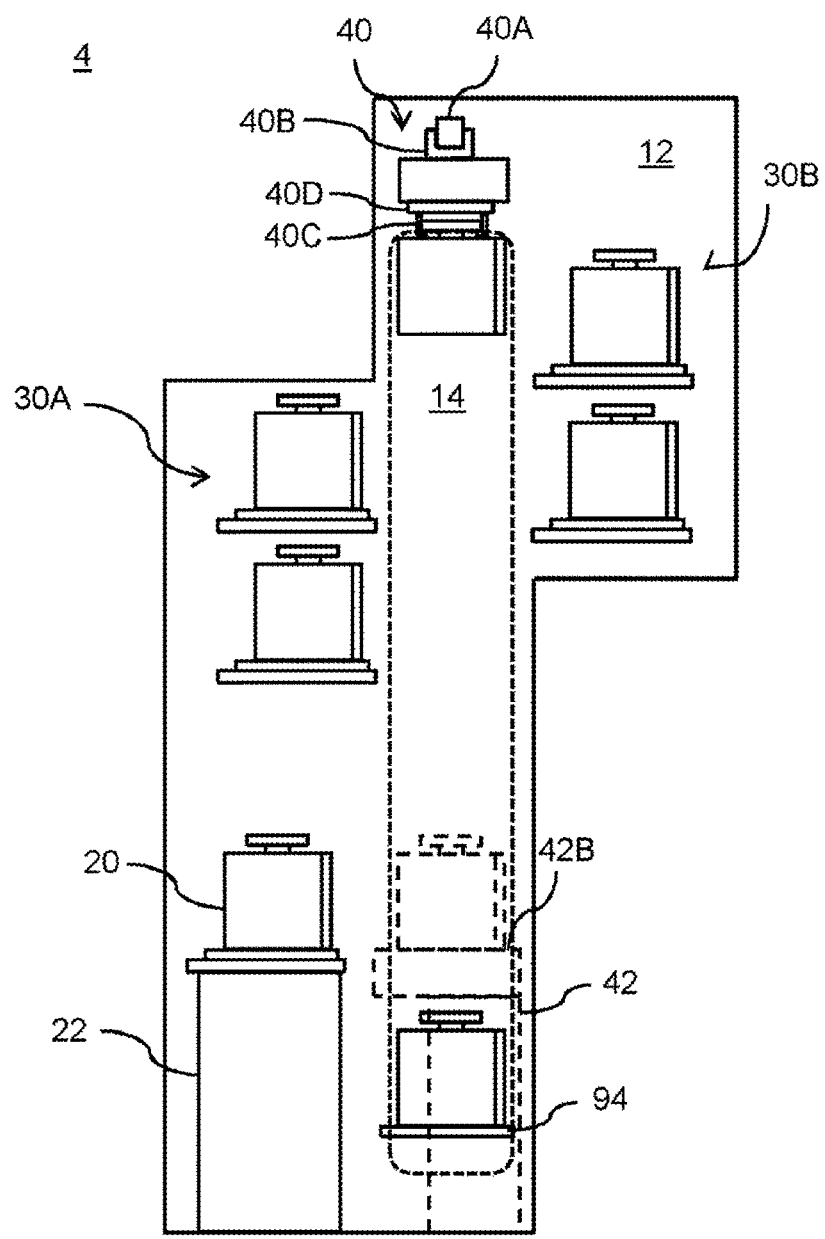
FIG. 11 is a vertical cross sectional view of an accommodating chamber that is suitably used in a third embodiment of the present disclosure.

Next, a third embodiment will be described with reference to FIG. 11. The third embodiment is different from the aforementioned embodiment in that a fixed shelf 94 is installed in the pod transfer region 14 below the accommodating chamber 12. Substantially the same elements as the elements described in the aforementioned embodiment are given the same reference numerals and a description thereof will be omitted.

The fixed shelf 94 is installed below the accommodating chamber 12 which is a position that does not interfere with the horizontal movement of the AGV port 22. Furthermore, since the fixed shelf 94 is installed in the pod transfer region 14, there is no need to horizontally move the stage for loading the pod 20. For example, in FIG. 1, the fixed shelf 94 is disposed at a position facing the AGV port 22 next to the load port 42. By installing the fixed shelf 94 at a position which is within the pod transfer region 14 and does not interfere with the horizontal movement of the stage 25 of the storage shelves 30 or the AGV port 22 in this way, it is possible to increase the number of pods 20 to be accommodated within the accommodating chamber 12.

The embodiments of the present disclosure have been described in detail above. However, the present disclosure is not limited to the aforementioned embodiments and may be differently changed without departing from the spirit of the present disclosure.

For example, in the aforementioned embodiments, there has been described an example in which the HCDS gas is used as the precursor gas, but the present disclosure is not limited to the embodiments. For example, as the precursor gas, it may be possible to use, in addition to the HCDS gas, an inorganic halosilane precursor gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane, i.e., silicon tetrachloride (SiCl, abbreviation: STC) gas, an octachlorotrisilane ($Si_3Cl_8$, abbreviation: OCTS) gas or the like, or an amino-based (amine-based) silane precursor gas not containing a halogen group such as a tris-dimethylaminosilane ($Si[N(CH_3)_2]_3H$, abbreviation: 3DMAS) gas, a tetrakis-dimethylaminosilane ($Si[N(CH_3)_2]_4$, abbreviation: 4DMAS) gas, a bis-diethylaminosilane ($Si[N(C_2H_5)_2]_2H_2$, abbreviation: BDEAS) gas, or a bis-tert-butylaminosilane ($SiH_2[NH(C_4H_9)]_2$, abbreviation: BTBAS) gas or the like. In addition, as the precursor gas, it may be possible to use an inorganic silane precursor gas not containing a halogen group such as a monosilane ($SiH_4$, abbreviation: MS) gas, a disilane ($Si_2H_6$, abbreviation: DS) gas, a trisilane ($Si_3H_5$, abbreviation: TS) gas or the like.

Furthermore, for example, in the aforementioned embodiments, there has been described an example in which the $NH_3$ gas is used as the reaction gas, but the present disclosure is not limited to the embodiments. For example, as the reaction gas, it may be possible to use, in addition to the $NH_3$ gas, a hydronitrogen-based gas such as a diazene ($N_2H_2$) gas, a hydrazine ($N_2H_4$) gas, an $N_3H_8$ gas or the like, or a gas containing these compounds. In addition, as the reaction gas, it may be possible to use an ethylamine-based gas such as a triethylamine (($C_2H_5)_3N$, abbreviation: TEA) gas, a diethylamine ((C$_2$H$_5$)$_2$NH, abbreviation: DEA) gas, a monoethylamine (C$_2$H$_5$NH$_2$, abbreviation: MEA) gas or the like, or a methylamine-based gas such as a trimethylamine ((CH$_3$)$_3$N, abbreviation: TMA) gas, a dimethylamine ((CH$_3$)$_2$NH, abbreviation: DMA) gas, a monomethylamine (CH$_3$NH$_2$, abbreviation: MMA) gas or the like. Also, as the reaction gas, it may be possible to use an organic hydrazine gas such as a trimethylhydrazine ((CH$_3$)$_2$N$_2$(CH$_3$)H, abbreviation: TMH) gas or the like.

Furthermore, for example, in the aforementioned embodiments, there has been described an example in which the SiN film is formed by using the HCDS gas as the precursor gas and a nitrogen (N)-containing gas (nitriding gas) such as the NH$_3$ gas as the reaction gas. However, the present disclosure is not limited to the aforementioned embodiments. For example, an SiO film, an SiON film, an SiOCN film, an SiOC film, an SiCN film, an SiBN film, an SiBCN film or the like may be formed by using, in addition to these gases, an oxygen (O)-containing gas such as an oxygen (O$_2$) gas (oxidizing gas), a carbon (C)-containing gas such as a propylene (C$_3$H$_6$) gas, a boron (B)-containing gas such as a boron trichloride (BCl$_3$) gas, or the like, for example, by the film forming sequences described above. In addition, the order of allowing each gas to flow may be appropriately changed. Even in the case of forming these films, a film may be formed under the same processing conditions as those of the aforementioned embodiments, and the same effects as those of the aforementioned embodiments may be achieved.

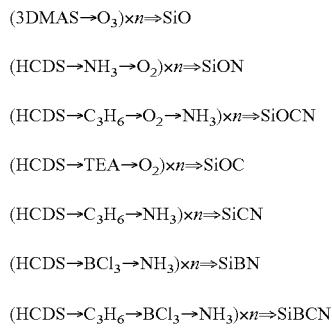

Furthermore, in the aforementioned embodiments, there has been described an example in which a silicon-based insulating film such as the SiN film is formed. However, the present disclosed is not limited to the embodiments. For example, the present disclosure may be suitably applied to a case where a film containing a metal element such as titanium (Ti), zirconium (Zr), hafnium (Hf), tantalum (Ta), niobium (Nb), aluminum (Al), molybdenum (Mo), tungsten (W) or the like, i.e., a metal film, is formed on the wafer W.

The present disclosure may be suitably applied to, for example, a case where a TiN film, a TiO film, a TiON film, a TiOCN film, a TiOC film, a TiCN film, a TiBN film, a TiBCN film, a ZrN film, a ZrO film, a ZrON film, a ZrOCN film, a ZrOC film, a ZICN film, a ZrBN film, a ZrBCN film, an HfN film, an HfD film, an HfON film, an HfOCN film, an HfOC film, an HfCN film, an HfBN film, an HfBCN film, a TaN film, a TaO film, a TaON film, a TaOCN film, a TaOC film, a TaCN film, a TaBN film, a TaBCN film, an NbN film, an NbO film, an NbON film, an NbOCN film, an NbOC film, an NbCN film, an NbBN film, an NbBCN film, an AlN film, an AlO film, an AlON film, an AlOCN film, an AlOC film, an AlCN film, an AlbN film, an AlbCN film, an MoN film, an MoO film, an MoON film, an MoOCN film, an MoOC film, an MoCN film, an MoBN film, an MoBCN film, a WN film, a WO film, a WON film, a WOCN film, a WOC film, a WCN film, a WBN film, a WBCN film, or the like is formed on the wafer W. In addition, the present disclosure may be suitably applied to a case where a film doped (added) with another element to these or one of these, for example, a TiAlN film, a TaAlN film, a TiAlC film, a TaAlC film, a TiSiN film, a TiSiC film, or the like is formed.

In the case of forming the metal film, as the precursor gas, it may be possible to use, for example, an inorganic metal precursor gas containing a metal element and a halogen element such as a titanium tetrachloride (TiCl$_1$) gas, a titanium tetrafluoride (TiF$_4$) gas, a zirconium tetrachloride (ZrCl$_4$) gas, a zirconium tetrafluoride (ZrF$_4$) gas, a hafnium tetrachloride (HfCl$_4$) gas, a hafnium tetrafluoride (HfF$_4$) gas, a tantalum pentachloride (TaCl$_5$) gas, a tantalum pentafluoride (TaFs) gas, a niobium pentachloride (NbCl$_5$) gas, a niobium pentafluoride (NbF$_5$) gas, an aluminum trichloride (AlCl$_3$) gas, an aluminum trifluoride (AlF$_3$) gas, a molybdenum pentachloride (MoCl$_5$) gas, a molybdenum pentafluoride (MoF$_5$) gas, a tungsten hexachloride (WCl$_6$) gas, a tungsten hexafluoride (WF$_6$) or the like. In addition, as the precursor gas, it may be possible to use, for example, a metal element such as a trimethyl aluminum (Al(CH$_3$)$_3$, abbreviation: TMA) gas and an organic metal precursor gas containing carbon. As the reaction gas, it may be possible to use the same gas as in the aforementioned embodiments.

For example, a TiN film, a TiO film, a TiON film, a TiCN film, a TiAlC film, a TiAlN film, a TiSiN film, or the like may be formed on the wafer W by the film forming sequences shown below.

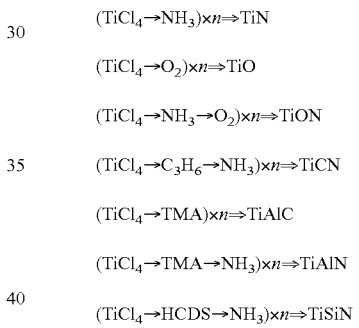

In addition, the order of allowing each gas to flow may be appropriately changed. Even in the case of forming these films, a film may be formed under the same processing conditions as those of the aforementioned embodiments, and the same effects as those of the aforementioned embodiments may be achieved.

That is, the present disclosure may be suitably applied to a case where a film containing a predetermined element such as a semiconductor element or a metal element is formed.

Furthermore, in the aforementioned embodiments, there has been described an example in which a film is deposited on the wafer W. However, the present disclosure is not limited to the embodiments. For example, the present disclosure may be applied to a case where the processing such as oxidizing, diffusing, annealing, etching or the like is performed on the wafer W, a film formed on the wafer W, or the like.

The embodiments and modifications described above may be appropriately combined with one another. In addition, the processing conditions used at this time may be similar to, for example, the processing conditions of the embodiments and modifications described above.

According to the present disclosure in some embodiments, it is possible to reduce a footprint of an apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
an accommodating chamber including a storage shelf configured to load a storage vessel that accommodates a substrate;
a transfer mechanism installed in a ceiling part of the accommodating chamber, and configured to hold an upper portion of the storage vessel and transfer the storage vessel within a transfer region in a lateral direction and a vertical direction;
ports disposed in front of the transfer region and configured to load and unload the storage vessel to and from the accommodating chamber; and
a controller configured to control a horizontal driving mechanism to horizontally move a stage between a loading position for loading the storage vessel and a transfer position beneath, in the vertical direction, the transfer mechanism for transferring the storage vessel to the transfer mechanism,
wherein the ports each comprises:
an adjustment plate fixed onto a base;
the stage configured to bear the storage vessel; and
the horizontal driving mechanism installed on an upper portion of the adjustment plate, connected to a near portion of a lower surface of the stage, and configured to project the stage backward from the loading position and retreat the stage from the transfer position such that the transfer mechanism is operable to transfer the storage vessel within the transfer region in the vertical direction under the transfer position.

2. A substrate processing apparatus, comprising:
an accommodating chamber including a storage shelf configured to load a storage vessel that accommodates a substrate;
a transfer mechanism installed in a ceiling part of the accommodating chamber, and configured to hold an upper portion of the storage vessel and transfer the storage vessel within a transfer region in a lateral direction and a vertical direction;
ports disposed in front of the transfer region and configured to load and unload the storage vessel to and from the accommodating chamber, wherein each of the ports comprise an adjustment plate fixed onto a base, and a stage configured to bear the storage vessel; and
a controller configured to control a horizontal driving mechanism to horizontally move the stage between a loading position for loading the storage vessel and a transfer position beneath, in the vertical direction, the transfer mechanism for transferring the storage vessel to the transfer mechanism;
wherein the horizontal driving mechanism comprises:
a pair of guide parts arranged in parallel and configured to guide a horizontal movement of the stage,
a connection portion that connects respective first ends of the pair of guide parts to each other,
a connection member fixed to the near portion of a lower surface of the stage and arranged on the pair of guide parts, and a first driving part including a rod, which is installed between the pair of guide parts and configured to press the connection portion of the pair of guide parts, and configured to horizontally move the pair of guide parts by horizontally moving the rod.

3. The apparatus of claim 2, further comprising:
two sensors arranged on the upper portion of the adjustment plate, and configured to detect a position of the stage; and
a detection member installed on at least one of second ends of the pair of guide parts, and configured to pass through a detection portion of the two sensors,
wherein the two sensors are configured to detect the loading position and the transfer position, respectively.

4. The apparatus of claim 2, wherein the horizontal driving mechanism further comprises:
a plurality of pulleys installed at both inner ends of one of the pair of guide parts;
a transfer portion arranged across the plurality of pulleys, and fixed to the connection member via a first fixing portion; and
a second fixing portion configured to fix the transfer portion and the adjustment plate, and
wherein the stage is horizontally moved by rotating the transfer portion and horizontally moving the pair of guide parts.

5. The apparatus of claim 1, wherein the stage has an opening at a front leading end of the stage.

6. A substrate processing apparatus, comprising:
an accommodating chamber including a loading shelf configured to load a storage vessel that accommodates a substrate;
a transfer mechanism installed in a ceiling part of the accommodating chamber, and configured to hold an upper portion of the storage vessel and transfer the storage vessel;
a port configured to load and unload the storage vessel to and from the accommodating chamber, and comprising:
an adjustment plate fixed onto a base,
a stage configured to load the storage vessel, and
a horizontal driving mechanism installed on an upper portion of the adjustment plate, connected to a rear portion of a lower surface of the stage via a connection member, and configured to horizontally move the stage; and
a controller configured to control the horizontal driving mechanism to horizontally move the stage between a loading position for loading the storage vessel and a transfer position for transferring the storage vessel to the transfer mechanism,
wherein the horizontal driving mechanism comprises:
a pair of guide parts configured to guide a horizontal movement of the stage, respective first ends of the pair of guide parts being connected to each other; and
a first driving part installed between the pair of guide parts, and configured to press a connection portion of the pair of guide parts, and
wherein the port further comprises a vertical movement mechanism configured to move the base up and down.

7. The apparatus of claim 6, wherein the vertical movement mechanism comprises:
a shaft connected to the base; and
a second driving part configured to drive the shaft up and down.

8. The apparatus of claim 6, further comprising a load port installed to face the port, and configured to open and close the storage vessel,
wherein a position of a loading portion of the load port overlaps with the transfer position of the port.

9. The apparatus of claim 8, wherein if an additional storage vessel has been loaded on the load port, the controller is configured to control the horizontal driving mechanism, the vertical movement mechanism, and the transfer mechanism so as to transfer the storage vessel by raising the base to a first height position that does not interfere with the additional storage vessel on the load port, moving the transfer mechanism above the transfer position of the stage, and moving the stage to the transfer position.

10. The apparatus of claim 8, wherein if an additional storage vessel has not been loaded on the load port, the controller is configured to control the horizontal driving mechanism, the vertical movement mechanism, and the transfer mechanism so as to transfer the storage vessel by raising the base to a second height position lower than a first height position, moving the transfer mechanism above the transfer position of the stage, and moving the stage to the transfer position.

11. The apparatus of claim 9, wherein the controller is configured to control the vertical movement mechanism and the horizontal driving mechanism so as to simultaneously raise the base and move the transfer mechanism.

12. The apparatus of claim 10, wherein the controller is configured to control the horizontal driving mechanism and the vertical movement mechanism so as to raise the base to the second height position, move the stage above the loading portion of the load port, lower the base to load the storage vessel on the load port, move the stage to the loading position, and lower the base.

13. A method of manufacturing a semiconductor device by using the substrate processing apparatus of claim 1, comprising:
transferring the storage vessel from the port to the storage shelf by horizontally moving the stage and holding, by the transfer mechanism, which has been moved above the stage, the upper portion of the storage vessel;
transferring the substrate in the storage vessel into a process chamber; and
processing the substrate in the process chamber.

14. A method of manufacturing a semiconductor device by using the substrate processing apparatus of claim 2, comprising:
transferring the storage vessel from the port to the storage shelf by horizontally moving the stage and holding, by the transfer mechanism, which has been moved above the stage, the upper portion of the storage vessel;
transferring the substrate in the storage vessel into a process chamber; and
processing the substrate in the process chamber.

15. The apparatus of claim 2, wherein the stage has an opening at a front leading end of the stage.

* * * * *